United States Patent [19]

Hosack

[11] Patent Number: 5,252,509
[45] Date of Patent: Oct. 12, 1993

[54] CCD IMAGER RESPONSIVE TO LONG WAVELENGTH RADIATION

[75] Inventor: Harold H. Hosack, Dallas, Tex.

[73] Assignee: Texas Instruments Incorporated, Dallas, Tex.

[21] Appl. No.: 891,375

[22] Filed: May 29, 1992

Related U.S. Application Data

[62] Division of Ser. No. 168,214, Mar. 15, 1980, Pat. No. 5,159,419.

[51] Int. Cl.$^5$ .................. H01L 21/70; H01L 27/00
[52] U.S. Cl. .................................. 437/53; 437/50; 437/67; 437/79; 437/203; 156/645; 257/215; 257/242; 257/244
[58] Field of Search ............... 437/69, 228, 18, 60, 437/67, 50, 53, 203, 63–64, 78–79, 74; 156/645, 644; 357/24, 50

[56] References Cited

U.S. PATENT DOCUMENTS

| 4,137,625 | 2/1979 | White . |
| 4,229,752 | 10/1980 | Hynecek . |
| 4,234,362 | 11/1980 | Riseman . |
| 4,353,086 | 10/1982 | Jaccodine et al. ............... 357/51 |
| 4,671,851 | 6/1987 | Beyer et al. ...................... 437/69 |
| 4,784,720 | 11/1988 | Douglas .......................... 437/241 |
| 4,857,981 | 8/1989 | Matsumoto et al. . |
| 4,861,729 | 8/1989 | Fuse et al. ........................ 437/18 |
| 4,878,102 | 10/1989 | Bakker et al. . |

FOREIGN PATENT DOCUMENTS 62-86862  4/1987  Japan .
62-290175 12/1987 Japan .

Primary Examiner—Robert Kunemund
Assistant Examiner—H. Jey Tsai
Attorney, Agent, or Firm—Alan K. Stewart; B. Peter Barndt; Richard L. Donaldson

[57] ABSTRACT

An infrared or x-ray imaging CCD array, including deep trench isolation (56) for capturing electron carriers formed deep in the substrate (46) as a result of long wavelength radiation or high energy particles. In virtual phase CCD circuits, the trench has formed on the sidewalls thereof a diffusion (58, 60) defining a vertical conductor for allowing hole carrier conduction between the substrate (46) and the virtual phase electrode (38).

15 Claims, 2 Drawing Sheets

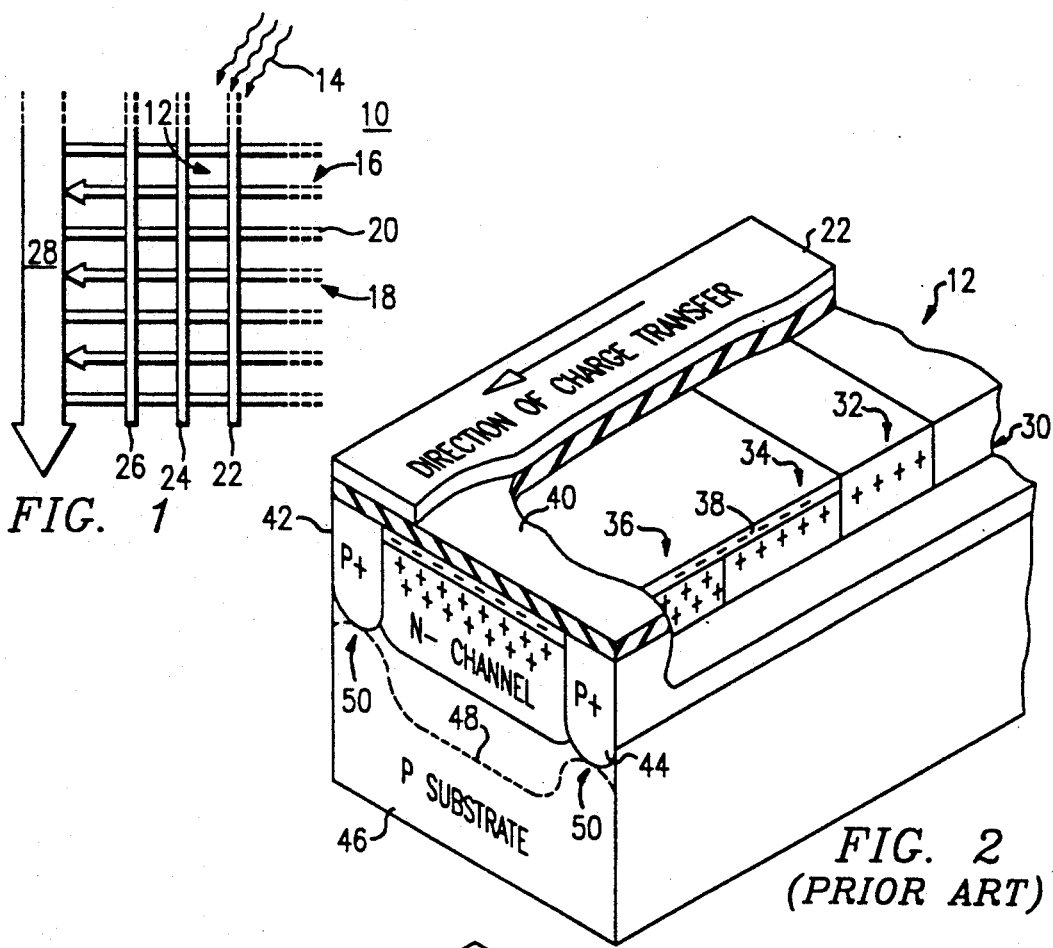
FIG. 1
FIG. 2 (PRIOR ART)
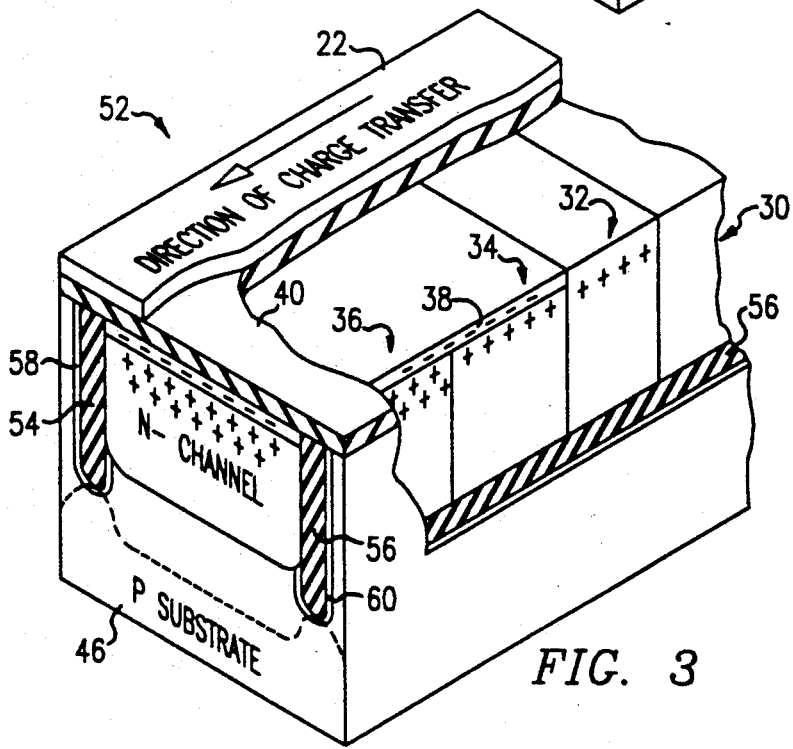
FIG. 3

CCD IMAGER RESPONSIVE TO LONG WAVELENGTH RADIATION

This is a division, of application Ser. No. 07/168,214, filed Mar. 15, 1988, now U.S. Pat. No. 5,159,419.

TECHNICAL FIELD OF THE INVENTION

The present invention relates in general to image conversion apparatus and techniques, and more particularly to charge coupled device (CCD) type of imagers which are responsive to long wavelength radiation such as infrared light, and x-rays.

BACKGROUND OF THE INVENTION

A CCD imager constructed according to well known techniques comprises a matrix of many cells, each responsive to visible light for generating a number of electrons based upon the intensity of light impinging on the cells. The electrons collected within each cell of the matrix are then shifted to an output, and serialized, to produce an analog signal which corresponds to a portion of the image. The analog signals can then be amplified and re-transmitted to a CRT or other type of television screen. Typically, CRT displays take the serial signals and by raster-scan techniques, regenerate the image on the phosphor screen of the CRT.

CCD imagers are typically utilized in television cameras and other types of picture processing equipment to function as a transducer for converting visible images into corresponding electrical signals. CCD imagers adapted for such use are described in detail in U. S. Pat. No. 4,229,752, assigned to Texas Instruments Incorporated. The light energy reflected from an object is converted into an electrical image in the silicon material of the CCD integrated circuit. A CCD imager typically comprises a matrix of several thousand individual silicon cells which are exposed to the light reflected from the object. The photons which are characteristic of the reflected visible light enter the silicon cells and generate a number of electron-hole pairs in correspondence to the light intensity. Thus, for light rays having a high intensity, a larger number of electron-hole pairs will be generated than light rays having a low intensity. Each cell of the CCD array is isolated from the adjacent cells so that the generated electrons within the cells remain associated with each respective cell. In this manner, an electrical image representative of the object image is thus captured. The substrate of the silicon CCD imager is biased to remove the holes of the electron-hole pairs, thereby leaving the captured electrons as the charge which is representative of the object image.

The isolation which typically separates the CCD cells comprises a boron diffusion which extends down into the silicon material sufficiently to provide lateral isolation between the cells. Photons associated with visible light enter the silicon material and generate electron-hole pairs at a depth generally no greater than about 0.1–0.3 microns. Hence, boron diffusions to such depth are adequate to prevent the electrons captured in one cell from migrating to an adjacent cell. CCD imagers fabricated according to such techniques are generally inadequate to convert long wavelength object images or images from higher energy radiation, such as x-rays, into corresponding electrical signals, as the radiation thereof penetrates more deeply into the silicon material before electron-hole pairs are generated. Accordingly, the generated electrons do not become captured in each cell, and thus migrate laterally. This lateral migration results in a poor picture resolution, wherein the video picture tends to smear. Some attempts have been made to improve device performance by increasing the depletion region in the silicon substrate via increased substrate resistivity, however, the advantages of this approach have been limited because of the unavailability of a good lateral isolation scheme.

Attempts to form a deeper lateral isolation by driving the boron diffusion deeper into the silicon substrate provide an inadequate isolation structure, in that the diffusions also spread laterally, thus requiring significantly more wafer area per cell. Such deep isolations are therefore counterproductive with regard to attempts to increase the packing density or increase the number of CCD cells per chip. In the virtual phase type of CCD arrays, there must also be provided a conductive path between the substrate and the virtual phase electrode for proper cell operation. Thus, deep nonconductive cell isolation structures alone do not provide an adequate solution for cell isolation.

From the foregoing, it can be seen that a need exists for an improved CCD cell isolation technique which provides deeper isolation structures, without requiring additional lateral wafer area. An associated need exists for a CCD imager which is responsive to longer radiation wavelengths to provide corresponding pictorial displays of infrared radiation, x-ray radiation and other long wavelength radiations. Yet another need exists for a deep isolation cell structure and a vertical conductor to render virtual phase CCD circuits responsive to the noted types of radiation.

SUMMARY OF THE INVENTION

In accordance with the invention, there is provided a CCD imager structure, and method of fabrication thereof, which eliminates or substantially reduces the shortcomings of imagers heretofore known. In accordance with the invention, the cells of a CCD-type imager are isolated by fabricating deep and narrow trenches around each cell, and filling the trenches with a dielectric to provide lateral electrical isolation therebetween.

In the preferred form of the invention, the trench structures are formed as deeply as 15–40 microns into the silicon material to provide lateral isolation for the electrons generated by either long wavelength radiation or high energy particles.

When employed in connection With Virtual phase type of CCD imagers, the invention further includes the formation of a vertical conductor to provide sufficient conductivity for charge carriers to reach the virtual electrode, for bias purposes. Preferably, the trench can be employed in constructing the conductor by first anisotropically etching a deep trench, and then diffusing an impurity into the trench sidewalls. The trench can then be filled and planarized. This structure provides lateral electrical isolation between adjacent cells, as well as a conductive medium between the surface silicon and the chip substrate.

In other embodiments, the deep isolation structure can be fabricated as a deep silicon oxide filled trench, with a vertical conductor defined by a diffusion or a conductive pillar of material.

BRIEF DESCRIPTION OF THE DRAWINGS

Further features and advantages will become more apparent from the following and more particular description of the preferred embodiment of the invention, as illustrated in the accompanying drawings in which like reference characters generally refer to the same parts, regions or structures throughout the view, and in which:

FIG. 1 illustrates in a simplified form a portion of a CCD image array;

FIG. 2 is an oblique sectional view taken through one exemplary CCD cell, illustrating a cell isolation structure heretofore known in the art;

FIG. 3 illustrates an oblique sectional view of a CCD cell, constructed in accordance with the invention.

DETAILED DESCRIPTION OF THE INVENTION

Figure 4:
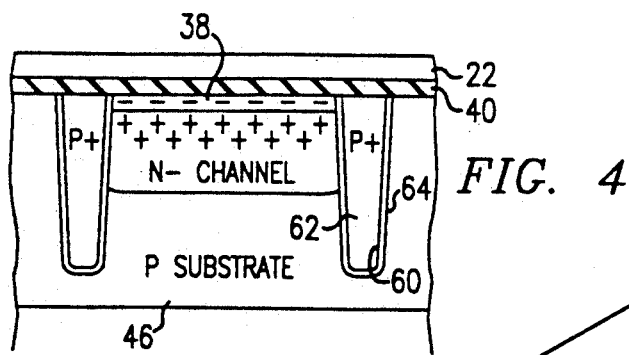
FIGS. 4-6 illustrate another embodiments of a CCD cell according to the invention.

The features and advantages of the invention are best understood by referring first to FIG. 1 of the drawings where there is illustrated a small portion of a CCD image array. Shown is a CCD array 10, with a number of pixel cells, one shown as reference character 12. Each of the pixel cells 12 is responsive to the intensity of light 14 shining thereon for storing a corresponding electrical charge. The individual charge packets stored at each of the pixel cell locations 12, all taken together, are representative of the image to which the array 10 is exposed. The CCD image array 10 can be utilized in video camera equipment for converting an image into either an electrical representation for storage, or for presentation on a display screen. A number of pixel cells forming a row 16 are isolated from an adjacent pixel cell row 18 by a conventional diffused channel stop 20. All pixel rows are similarly isolated from adjacent rows in the array 10 by similar elongate diffused channel stops 20.

Formed as part of the CCD image array 10 are a number of individual gate electrodes 22-26, each of which can be individually clocked to move stored charge from one cell in a row, to an adjacent cell in the same row. In the illustration, a clock signal applied first to gate electrode 22, then to gate electrode 24, and subsequently to gate electrode 26 would be effective to move the charge sequentially from all of the array cells to adjacent cells, in a direction to the left. In this manner, columns of charge packets are sequentially presented to a multibit serial shift register 28 which can serially transfer the charge packet information to a CCD output. As can be appreciated, the serial shift register 28 would be clocked at a rate higher than that which is applied to the gate electrodes 22 by a factor which corresponds to the number of pixel cell rows in the array 10.

FIG. 2 illustrates a typical virtual phase pixel cell 12 constructed according to prior art techniques. Each illustrated pixel cell 12 typically includes a clocked barrier 30, a clocked well 32, a virtual barrier 34 and a virtual well 36. The virtual barrier 34 and virtual well 36 define a virtual phase area, having a virtual electrode 38 which is formed generally by a P type implanted layer at the surface of the virtual phase. The virtual electrode 38 functions to shield that portion of each cell from any gate-induced change in potential which is applied as a clock signal to the gate electrode 22. The gate electrode 22 is electrically isolated from the underlying semiconductor silicon cell by a silicon oxide layer 40.

Importantly, and as noted above, a row of pixel cells is electrically isolated from adjacent cell rows by the channel stop diffusion, depicted in FIG. 2 as reference characters 42 and 44. In addition to providing lateral electrical isolation, the channel stop areas 42 and 44 provide another important function. Significantly, the conductive channel stop regions 42 and 44 provide a vertical conductor between the virtual phase electrode 38 and the chip substrate 46. The substrate is shown as being P type. Hole current from the channel stop regions 42 and 44 are attracted to the surface of the N channel, thus providing a shield region above the virtual phase regions 34 and 36 shielding the virtual phase area from the effects of clock pulse voltages carried by the gate conductor 22. Hence, an important and unique requirement of a virtual phase CCD device is the need to provide a contact from the substrate 46 to the virtual phase area in order to provide a bias to the virtual electrode 38. In order to provide a conduction path between the P substrate 46 and the virtual phase electrode 38, a depletion region 48 formed in the substrate 46 must reach to the channel stop regions 42 and 44. The contact could be provided by a surface contact to the channel stop diffusion, but this approach is generally avoided because of its large space requirement in the cell. In multiple phase CCD circuits, the boundary of the depletion region 48 need not touch the channel stop areas 42 and 44, but rather need only exhibit an appropriate dip to isolate the charge in the individual CCD cells.

As noted, virtual phase CCD circuits must be constructed such that the depletion region 48 reaches the top of the substrate 46 to allow the charge carriers to flow between the virtual phase and the substrate to provide bias to the virtual electrode 38. The proper biasing of the virtual electrode 38 is necessary to the operation of virtual phase CCD circuits. The requirement for the electrical contact between the substrate 46 and the virtual phase electrode 38 generally results in a substantially larger area requirement for the potential drop to the final channel potential level, especially in virtual phase devices. This increased width reduces the effective charge handling capacity of the CCD channel, and in high density designs, may even eliminate the channel completely.

While the virtual phase type of CCD structure provides a high yield and improved performance, the need for a substrate contact presents certain design limitations. In particular, the substrate contact in virtual phase structures is generally provided by the undepleted region beneath the channel stop areas 42 and 44, such as shown by reference character 50. The undepleted regions 50 of the substrate 46 are the result of the relatively wide, heavily doped channel stop regions 42 and 44. This type of structure limits both the CCD cell size and the minimum width which may be utilized for the channel stop areas 42 and 44, since for wide channel stop regions, the cell cannot be made very small, and for very narrow width channel stop areas, the substrate area therebelow tends to deplete therethrough and result in the electrical isolation between the substrate 46 and the virtual phase electrode 38. When the vertical conduction ceases, the operation of the CCD cell also ceases. With current semiconductor fabrication techniques, the minimum geometries which can be employed to form channel stops are approximately two microns. This presents a severe limitation in attempts to further reduce the size of the CCD cells 12, and thus the ability to improve image resolution by increasing the number of cells per unit of wafer area.

FIG. 3 illustrates a virtual phase CCD cell 52 constructed according to the preferred embodiment of the invention. According to the invention, deep trench isolation structures 54 and 56 provide lateral isolation between rows of cells and thereby provide the charge capturing capability of each cell when used in conjunction with long wavelength radiation or high energy photons. As noted above, such type of photons penetrate the silicon material more deeply than visible light, before generating the electron-hole pairs. In addition, the outer sidewalls of the isolation trenches 54 and 56 have a doped layer 58 and 60 to provide the vertical conductor to enable hole carriers to be conducted between the virtual phase electrode 38 and the substrate 46. It is to be understood that the principles of the invention can also be applied to multiphase CCD circuits which generally do not require the vertical conductor to the substrate, but in which the deep trench isolation would serve to insure high resolution for long wavelength or x-ray radiation.

According to the preferred form of the invention, the deep and narrow trenches are formed into the P substrate 46 by conventional anisotropic etching techniques, such as by reactive ion etch processes. Narrow trenches of 1-2 microns wide can be formed, and as deep as fifteen to forty microns into the P substrate to accommodate the use of a virtual phase CCD imager with x-rays or long wavelength infrared radiation. Next, the wafer undergoes a diffusion step in which a P type impurity, for example boron, is diffused into the sidewalls of the trench, thereby forming the doped layers 58 and 60. After the trenches are formed within the substrate 46, and the diffusion has been completed, a conformal layer of an electrical insulating material is formed on the surface of the wafer, thereby filling the deep trenches. An LPCVD deposition of a conformal silicon oxide, such as TEOS, is one example of a material which can uniformly fill the trenches and provide electrical isolation. The details of the particular steps in forming silicon oxide trench isolation structures are well known in the art, especially in the fabrication of semiconductor DRAM cells. The trench isolation structures themselves 54 and 56 can also be utilized in multiphase CCD cells to improve the response thereof to long wavelength radiation and high energy photons. The wafer can be planarized by suitable polishing or by utilizing a nonconformal coating of photoresist which is etchable at the same rate as the conformal silicon oxide material. The wafer is then etched to remove the photoresist mask as well as the surface coating of the conformal silicon oxide, thereby leaving a flat wafer surface topography.

FIG. 4 illustrates yet another embodiment of the invention for providing lateral isolation between cells and a vertical conductor between the virtual phase electrode and the substrate 46. In this embodiment, a trench 60 is formed into the substrate 46 to the depth necessary to provide adequate lateral isolation. Next, the trench 60 is filled with a highly doped polycrystalline silicon 62. The surface of the wafer can be planarized by the steps noted above. Then, the wafer is subjected to a heat treatment which comprises an elevated temperature for driving the impurities of the polysilicon 62 into the substrate 46, thereby forming a P type conductive layer 64 which is effective to provide a high degree of conductivity of hole carriers between the substrate 46 and the virtual phase electrode 38. This lateral insulating and vertical conductive structure presents certain advantages over that shown in FIG. 3. The polysilicon trench filling 62 obviates the need to grow or form a silicon oxide dielectric within the trench, which has the potential attendant disadvantage of the formation of imperfections and defects in the substrate 46, due to the expansion of the silicon material. Again, such an isolation structure can be employed in conjunction with the fabrication of multiphase CCD arrays.

Figure 5:
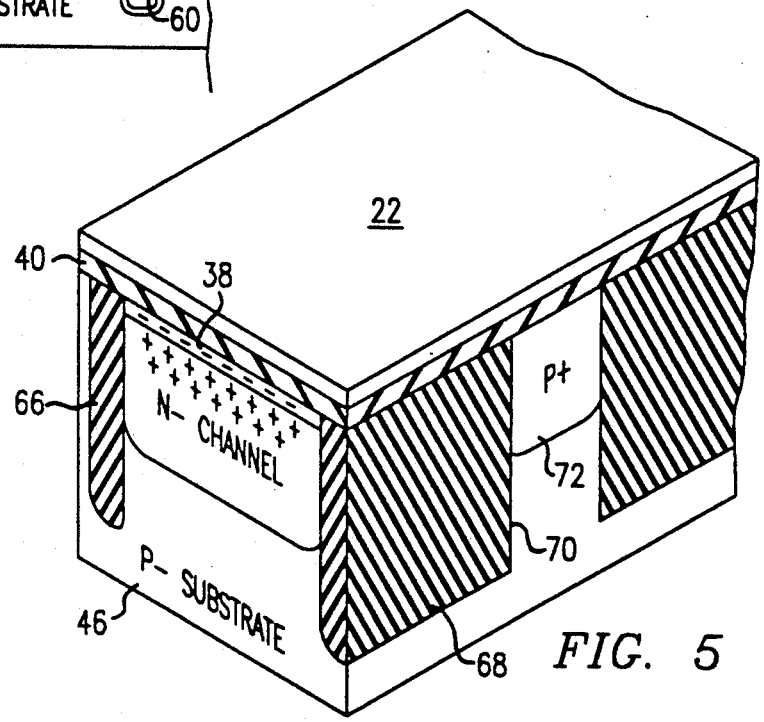

FIG. 5 illustrates yet another embodiment of the invention for providing lateral channel isolation and vertical conduction between the virtual phase and the silicon substrate 46. With the circuit construction shown in FIG. 5, the virtual phase pixel cell has deep lateral electrical isolation comprising the silicon oxide-filled trenches 66 and 68. However, each oxide-filled trench includes a discontinuity 70 formed therein on each side of the virtual phase channel. The trench discontinuity 70 includes a heavily-doped P type channel stop diffusion 72 formed therein. The channel stop plug 72 functions as the conductor for hole current between the substrate 46 and the virtual phase electrode 38. The channel stop plug 72 is formed as deep into the substrate 46 as required to allow contact with the depletion region formed during the electrical biasing of the cell. The depletion region (not shown) provides a degree of lateral isolation, as well as a mechanism for conducting hole current from the substrate 46 to the virtual phase electrode 38. As noted above, for multiphase CCD devices, the discontinuity 70 can be eliminated, whereby complete lateral isolation is provided between the rows of cells, as no vertical conductor is required.

Figure 6:
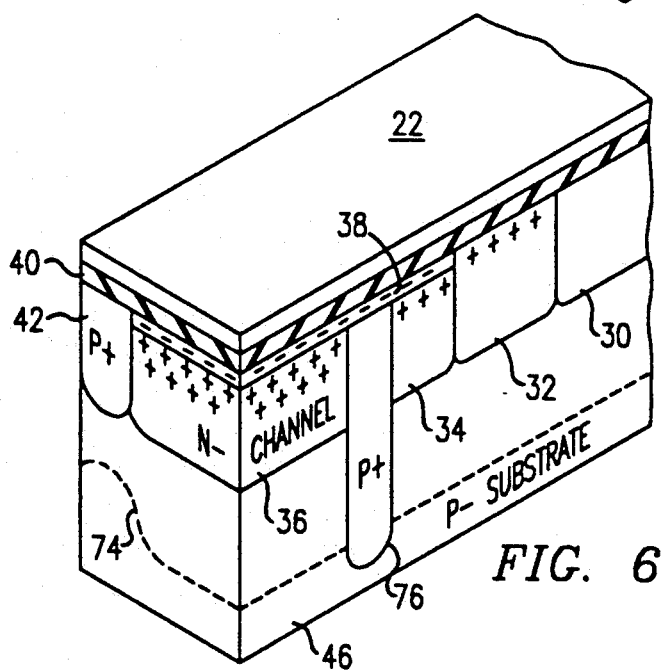

Still another embodiment of the invention is illustrated in FIG. 6. The virtual phase CCD cell depicted is shown sectioned through a central axis. Here, conventional shallow boron channel stops 42 are utilized for providing the lateral separation between rows of CCD pixel cells. Also, with the noted cell construction, the depletion boundary 74 need not contact the channel stop region 42, as there is provided a conductive plug or pillar 76 formed within the cell, extending from the virtual phase electrode 38 to the substrate 46. Preferably, the conductive plug 76 comprises a highly doped P type polysilicon. The conductive plug 76 can be formed by first etching a deep trench and filling the same with the conductive polysilicon. In this manner, a conduction channel is provided between the substrate 46 and the virtual phase electrode 38, even though the substrate depletion boundary does not contact the channel stop 42. While the conductive plug 76 is shown intermediate the virtual barrier 34 and the virtual well 36, such plug can be located anywhere within the cell, as long as it establishes electrical contact with the virtual phase electrode 38.

Those skilled in the art will readily realize that in forming the CCD cell structures shown in FIGS. 5 and 6, a few more mask and pattern steps may be required to form either the channel stop 72 within the discontinuity of the oxide-filled trench 68 or the conductive plug 76 which is formed between the virtual phase electrode 38 and the substrate 46. However, the operational advantages achieved by such cell structures outweigh the few extra processing steps required. Also, in fabricating the deep trench structures, the planarization can be advantageously accomplished by utilizing a mechanical wafer polishing process. Wafer planarization by polishing techniques may be efficiently and economically conducted, especially when utilizing deep trenches. For example, in fabricating a silicon wafer which is intended to be responsive to long wavelength infrared radiation, trenches up to 30-40 microns deep may be required. As a result, trenches may be formed which are 45-50 microns deep, be refilled and polished so as to remove the upper 5 microns, or so, thereby achieving a planarization, as well as completed trenches of a desired depth. Hence, even though the polishing process is rather imprecise, in that it is difficult to accurately remove layer thicknesses of less than 1-2 microns, the gross over-trenching and the corresponding polishing can result in trench depths close to a desired dimension.

From the foregoing, disclosed are numerous structures and techniques for providing lateral isolation between CCD cells to accommodate the lateral electrical isolation of electron-hole charges generated as a result of long wavelength radiation or high energy particles. In addition, when the invention is employed in connection with virtual phase CCD circuits, the trench structures themselves can provide the technical advantage of a vertical conductor which allows the transfer of hole charges between the virtual phase electrode and the substrate. As a result, an array of such CCD cells can be fabrication which is then responsive to long wavelength radiation and high energy particles which generate electron-hole pairs deep in the substrate, and which do not become dissipated in the substrate, but rather remain spatially associated with respective CCD cells. Accordingly, CCD arrays fabricated in accordance with the invention may find a variety of applications, including night vision equipment which requires a high degree of resolution for infrared radiation. In addition, CCD cells can be fabricated according to the invention to respond to x-rays for enhancing or facilitating astronomical observations, as well as provide a display of tooth or body structures for dental and surgical purposes. Indeed, a CCD array which is responsive to x-rays provides a technical advantage over the well-known technique of exposing a film to x-ray radiation. Such a technique is must less sensitive, in terms of resolution, than that available with an array of CCD elements.

While the preferred and other embodiments of the invention have been disclosed with reference to specific structures and fabrication methods, it is to be understood that many changes in detail may be made as a matter of engineering choices without departing from the spirit and scope of the invention, as defined by the appended claims.

What is claimed is:

1. In a CCD image array having a plurality of cells for imaging radiation from an object, a method for electrically isolating the cells, comprising the steps of:
   forming a trench within a semiconductor substrate to a depth sufficient to maintain charge carriers generated by the radiation associated with respective ones of said cells;
   forming a vertical conductor associated with said trench for providing vertical conduction of charge carriers between said substrate and electrodes of said cells; and
   filling said trench with a material to thereby provide electrical isolation between said ones of said cells.

2. The method of claim 1, further including forming said vertical conductor by diffusing a conductive impurity through the sidewalls of said trench.

3. The method of claim 1, further including forming said vertical conductor by filling said trench with a doped material.

4. The method of claim 3, further including annealing said substrate so that the impurities from said doped material are diffused around said trench into said substrate.

5. The method of claim 1, wherein said conductor is formed as a pillar of conductive material within each cell of said array.

6. The method of claim 1, further including isolating rows of said cells with elongate said trenches.

7. The method of claim 1, further including forming trenches in said substrate at a depth of about 5-8 microns to render said array responsive to light radiation in the near infrared spectrum.

8. The method of claim 1, further including forming said isolation trenches in said substrate at a depth of about 5-35 microns to thereby render said array responsive to x-ray radiation.

9. The method of claim 1, further including forming said isolation trenches in said substrate to a depth of about 30-40 microns to render said array responsive to long wavelength infrared radiation.

10. The method of claim 1, further including forming deep trenches in said substrate, filling said trench with a material, and mechanically polishing the substrate to planarize the surface thereof.

11. A method for fabricating a virtual phase CCD image array, comprising the steps of:
    forming an array of CCD cells in a semiconductor substrate;
    isolating said cells into rows by forming elongate trenches between said cell rows;
    diffusing an impurity into the sidewalls of said trenches to provide a vertical conductor for carrying electrical charges from the substrate to electrodes of said cells; and
    filling the trenches with a material.

12. The method of claim 11, further including filling said trenches with a dielectric material.

13. The method of claim 11, further including filling said trenches with a polysilicon.

14. The method of claim 11, further including forming said trenches at least 15 microns deep for maintaining radiation generated electrical carrier associated with ones of said cells.

15. The method of claim 11, further including forming a vertical conductive pillar defining said vertical conductor.

* * * * *